(12) United States Patent
Mueller

(10) Patent No.: US 9,484,518 B2
(45) Date of Patent: Nov. 1, 2016

(54) TUBULAR THERMOELECTRIC MODULE AND METHOD FOR PRODUCING THE MODULE

(71) Applicant: Emitec Gesellschaft fuer Emissionstechnologie mbH, Lohmar (DE)

(72) Inventor: Wilfried Mueller, Lindlar (DE)

(73) Assignee: EMITEC Gesellschaft fuer Emissionstechnologie mbH, Lohmar (DE)

( * ) Notice: Subject to any disclaimer, the term of this patent is extended or adjusted under 35 U.S.C. 154(b) by 0 days.

(21) Appl. No.: 13/770,076

(22) Filed: Feb. 19, 2013

(65) Prior Publication Data

US 2013/0160809 A1     Jun. 27, 2013

Related U.S. Application Data

(63) Continuation of application No. PCT/EP2011/063908, filed on Aug. 12, 2011.

(30) Foreign Application Priority Data

Aug. 18, 2010     (DE) .................... 10 2010 034 708

(51) Int. Cl.
    *H01L 35/32*    (2006.01)
    *H01L 35/34*    (2006.01)

(52) U.S. Cl.
    CPC .............. *H01L 35/32* (2013.01); *H01L 35/34* (2013.01)

(58) Field of Classification Search
    CPC ....... H01L 35/04; H01L 35/06; H01L 35/10; H01L 35/32; H01L 35/325; H01L 35/34; H01L 35/00; H01L 29/068; H01L 35/16; H01L 35/18; H01L 35/30

USPC ........ 136/200, 205, 208, 223, 230, 201, 212
    See application file for complete search history.

(56) References Cited

U.S. PATENT DOCUMENTS 3,054,840 A    9/1962    Alsing
3,201,504 A    8/1965    Stevens
(Continued)

FOREIGN PATENT DOCUMENTS

DE    102006039024 A1    2/2008
DE    102008005694 A1    8/2009
(Continued)

OTHER PUBLICATIONS

International Search Report of PCT/EP2011/063908.

*Primary Examiner* — Jayne Mershon
*Assistant Examiner* — Mayla Gonzalez Ramos
(74) *Attorney, Agent, or Firm* — Laurence A. Greenberg; Werner H. Stemer; Ralph E. Locher

(57) ABSTRACT

A method for producing a thermoelectric module and a tubular thermoelectric module include at least an inner tube, an outer tube and an interspace therebetween. At least a plurality of rings each formed by a plurality of n-doped and p-doped semiconductor elements disposed alternately in a circumferential direction are disposed in succession in an axial direction of the thermoelectric module in the interspace. On an inner side or an outer side of the semiconductor elements of one ring, electrically conductive first connections run only in the circumferential direction and, on an opposite outer side or inner side, at least one electrically conductive second connection electrically conductively connects an n-doped to a p-doped semiconductor element of an adjacent ring and runs at least in the axial direction of the thermoelectric module.

2 Claims, 4 Drawing Sheets

(56) References Cited

U.S. PATENT DOCUMENTS

| | | |
|---|---|---|
| 3,261,079 A | 7/1966 | Clingman, Jr. et al. |
| 3,269,872 A | 8/1966 | Thompson |
| 3,304,206 A | 2/1967 | Burdick et al. |
| 3,547,706 A | 12/1970 | McGrew |
| 3,859,143 A | 1/1975 | Krebs |
| 3,988,171 A | 10/1976 | Miller et al. |
| 5,228,923 A | 7/1993 | Hed |
| 5,362,983 A | 11/1994 | Yamamura et al. |
| 5,429,680 A | 7/1995 | Fuschetti |
| 6,400,013 B1 | 6/2002 | Tsuzaki et al. |
| 8,013,235 B2 | 9/2011 | Takahashi |
| 9,003,784 B2 | 4/2015 | Limbeck et al. |
| 2005/0172993 A1 | 8/2005 | Shimoji et al. |
| 2008/0023056 A1* | 1/2008 | Kambe et al. ............ 136/201 |
| 2009/0133734 A1 | 5/2009 | Takahashi |
| 2010/0031987 A1 | 2/2010 | Bell et al. |
| 2010/0147351 A1* | 6/2010 | Takahashi ............ 136/205 |
| 2010/0170551 A1 | 7/2010 | Hiroyama et al. |
| 2011/0023930 A1 | 2/2011 | Konig et al. |

FOREIGN PATENT DOCUMENTS

| | | | |
|---|---|---|---|
| EP | 1 780 808 A1 | | 5/2007 |
| JP | 61254082 A | | 11/1986 |
| JP | H04299585 A | | 10/1992 |
| JP | H0936439 A | | 2/1997 |
| JP | 9224387 A | | 8/1997 |
| JP | H09321352 A | | 12/1997 |
| JP | 10335710 A | | 12/1998 |
| JP | 2000049391 A | | 2/2000 |
| JP | 2000294840 A | | 10/2000 |
| JP | 2005223131 A | | 8/2005 |
| JP | 2008305991 A | * | 12/2008 |
| WO | 88/05964 A1 | | 8/1998 |
| WO | 2009013960 A1 | | 1/2009 |
| WO | 2010057578 A2 | | 5/2010 |

\* cited by examiner

TUBULAR THERMOELECTRIC MODULE AND METHOD FOR PRODUCING THE MODULE

CROSS-REFERENCE TO RELATED APPLICATION

This application is a continuation, under 35 U.S.C. §120, of copending International Application No. PCT/EP2011/063908, filed Aug. 12, 2011, which designated the United States; this application also claims the priority, under 35 U.S.C. §119, of German Patent Application DE 10 2010 034 708.6, filed Aug. 18, 2010; the prior applications are herewith incorporated by reference in their entirety.

BACKGROUND OF THE INVENTION

Field of the Invention

The present invention relates to a tubular thermoelectric module and to a method for producing a thermoelectric module. The thermoelectric module serves for generating electrical energy e.g. from the exhaust gas of an internal combustion engine of a motor vehicle using a generator. That is taken to mean, in particular, a generator for converting thermal energy of an exhaust gas into electrical energy, that is to say a so-called thermoelectric generator.

The exhaust gas from an engine of a motor vehicle has thermal energy, which can be converted into electrical energy through the use of a thermoelectric generator in order, for example, to fill a battery or some other energy storage device or to directly feed the required energy to electrical loads. The motor vehicle is thus operated with an improved energetic efficiency, and energy is available to a greater extent for the operation of the motor vehicle.

Such a thermoelectric generator includes at least one thermoelectric module. Thermoelectric materials are of such a type that they can effectively convert thermal energy into electrical energy (Seebeck effect) and vice versa (Peltier effect). Such thermoelectric modules preferably have a multiplicity of thermoelectric elements positioned between a so-called hot side and a so-called cold side. Thermoelectric elements include e.g. at least two semiconductor elements (p-doped and n-doped) which are alternately provided with electrically conductive bridges on their top side and underside toward the hot side and cold side, respectively. Ceramic plates or ceramic coatings and/or similar materials serve for insulating the electrically conductive bridges from a housing enclosing the thermoelectric module and are therefore preferably disposed between the electrically conductive bridges, in such a way that the semiconductor elements are insulated from the housing of a thermoelectric module and from one another. If a temperature gradient is provided on both sides of the semiconductor elements, then a voltage potential forms between the ends of the semiconductor element. The charge carriers on the hotter side are increasingly excited into the conduction band by the higher temperature. As a result of the concentration difference produced in this case in the conduction band, charge carriers diffuse to the colder side of the semiconductor element, as a result of which the potential difference arises. In a thermoelectric module, numerous semiconductor elements are electrically connected in series. In order to ensure that the generated potential difference of the serial semiconductor elements does not mutually cancel one another out, semiconductor elements with different majority charge carriers (n-doped and p-doped) are always alternately brought into direct electrical contact. The electric circuit can be closed through the use of a connected load resistor and electrical power can thus be tapped off.

It has already been attempted to provide corresponding thermoelectric generators for application in motor vehicles, in particular passenger cars. However, they have mainly been very expensive to produce and distinguished by a relatively low efficiency. Therefore, it has not yet been possible to attain suitability for series production.

SUMMARY OF THE INVENTION

It is accordingly an object of the invention to provide a tubular thermoelectric module and a method for producing the module, which overcome the hereinafore-mentioned disadvantages and at least partly solve the highlighted problems of the heretofore-known modules and methods of this general type. In particular, the intention is to specify a thermoelectric module which can be produced by a cost-effective method and, in particular, can be interconnected with other thermoelectric modules in a simple manner, and can thus form a thermoelectric generator. Furthermore, the intention is to specify a method for producing a thermoelectric module which is cost-effective and better suited to the series production of such thermoelectric modules.

With the foregoing and other objects in view there is provided, in accordance with the invention, a tubular thermoelectric module comprising at least an inner tube and an outer tube forming an interspace or gap therebetween. At least a plurality of rings each formed by a plurality of n-doped and p-doped semiconductor elements disposed alternately in a circumferential direction are disposed in succession in an axial direction of the thermoelectric module in the interspace. Furthermore, on an inner side or an outer side of the semiconductor elements of one ring, electrically conductive first connections run only in the circumferential direction and, on the opposite outer side or inner side, at least one electrically conductive second connection electrically conductively connects a semiconductor element of the ring to a semiconductor element of an adjacent ring. The electrically conductive second connection runs at least in an axial direction of the thermoelectric module.

In particular, the tubular thermoelectric module includes circular, elliptical or polygonal outer tubes and inner tubes, disposed substantially concentrically with respect to one another. The n-doped and p-doped semiconductor elements disposed alternately in the circumferential direction in the interspace are connected to one another by electrically conductive first connections through their outer sides or their inner sides. In this case, the adjacent n-doped and p-doped semiconductor elements are disposed in a manner spaced apart from one another and separated from one another, in particular, by an electrical insulation in the interspace. The electrical insulation is preferably realized by air or a vacuum, but can also be formed e.g. by a mica material or a ceramic.

The electrically conductive first connection present within a ring runs on an inner side or on an outer side of the semiconductor elements exclusively in the circumferential direction. In particular, correspondingly only at a location of the ring on an outer side or on an inner side, an electrically conductive second connection is formed between an n-doped and a p-doped semiconductor element which are each assigned to an adjacent ring. The electrically conductive second connection runs at least in an axial direction of the thermoelectric module. In particular, the electrically conductive second connection simultaneously also runs in the circumferential direction of the thermoelectric module. Such a configuration is provided, in particular, when n-doped and p-doped semiconductor elements in each at least adjacent ring are disposed at an identical circumferential coordinate in the interspace of the tubular thermoelectric module. The connection of a then adjacent n-doped and p-doped semiconductor element which are assigned to adjacent rings is effected by an electrically conductive second connection, which then firstly overcomes the distance between the adjacent rings in an axial direction and secondly produces an offset in the circumferential direction, in such a way that differently doped semiconductor elements are connected to one another. The electrically conductive second connection can be provided either on the inner side or on the outer side. In particular, the electrically conductive second connection is embodied identically for all rings disposed on the thermoelectric module, especially preferably also identically with regard to the position in the circumferential direction, and also identically with regard to the configuration on an outer side or on an inner side of the semiconductor elements.

In particular, corresponding contacts are embodied at the respective ends of the thermoelectric module, in such a way that an electrically conductive connection to other thermoelectric modules and/or to an electrical system, e.g. to a thermoelectric generator or to a power supply of a motor vehicle, can be ensured. The contacts are preferably likewise disposed at the identical positions mentioned above.

As a result, that means in other words that on the inner side/outer side very simple first connections only have to be formed in the circumferential direction along the rings, in such a way that a simple production process can be used for this purpose. The electrical series connection of the adjacent rings is then effected only on the other side (outer side/inner side) through the use of the second connection, in such a way that an asymmetrical embodiment of the electrically conductive connections on the inside and outside is realized in this case. This means, however, that the position of the electrically conductive second connections can be adapted to the mounting conditions in a simple manner.

In accordance with another particularly advantageous feature of the thermoelectric module of the invention, exclusively n-doped or p-doped semiconductor elements in each case are disposed at a circumferential coordinate in an axial direction. That means in other words, in particular, that in an axial direction of the thermoelectric module only one type of the semiconductor elements is disposed in succession substantially in alignment. This ensures that for the electrically conductive second connection it is possible to use a standard component which can be positioned equally exactly and simply between all the rings and reliably allows electrical contact-making. Moreover, mounting can also be facilitated in this way because the individual electrically conductive second connections can then also be disposed in alignment.

In accordance with a further advantageous feature of the thermoelectric module of the invention, in each ring an even number of semiconductor elements are disposed in succession in the circumferential direction in the interspace, wherein at least four semiconductor elements are provided. That is to say, in particular, that also six, eight, ten, twelve or more semiconductor elements are disposed in succession in the circumferential direction in the interspace. In the case of an even number of semiconductor elements, an electrically conductive connection of the semiconductor elements in the circumferential direction is possible in such a way that along an axial direction of the tubular thermoelectric module identical rings can be disposed in an identical manner both with regard to the configuration of n-doped and p-doped semiconductor elements and with regard to the configuration of the electrically conductive connections in succession.

The advantages of such a tubular thermoelectric module will also become apparent from the following description of the method according to the invention, which is suitable, in particular, for producing the thermoelectric module according to the invention. A plurality of such thermoelectric modules can be disposed in succession and electrically contact-connected in series. Therefore, they can be connected in series to form an elongated thermoelectric module. Likewise, a plurality of such tubular thermoelectric modules can be disposed in parallel with one another, in such a way that a thermoelectric tube bundle generator can thus be produced.

With the objects of the invention in view, there is concomitantly provided a method for producing a thermoelectric module, comprising at least the following steps:
a) providing an inner tube,
b) providing an outer tube,
c) placing semiconductor elements between the inner tube and the outer tube and providing the semiconductor elements with a length in the axial direction,
d) connecting the inner tube, the outer tube and the semiconductor elements, and
e) introducing at least one separating location at least into the outer tube and into the semiconductor elements, subdividing the length of the semiconductor elements into at least two sections.

The inner tube and the outer tube are, in particular, produced from the same material. For this purpose, steel materials are provided, for example, which can be used for housings of thermoelectric modules. However, the inner tubes and outer tubes can also be produced from different materials. In particular, inner tube or outer tube can be provided with a material with which the electrically conductive first connections and/or second connections of the thermoelectric module are formed, in such a way that they are formed e.g. of a nickel material or molybdenum material or copper material. In particular, it is possible for only the outer tube to be formed of a material for forming electrically conductive first connections and/or second connections, in such a way that the inner tube is made from a material for forming a housing part. In this case, in particular the inner tube can have e.g. imprinted electrically conductive first connections or/and second connections. In particular, the inner tube additionally has an electrical insulation layer that electrically insulates the inner tube and the electrically conductive connections thereon from one another.

The semiconductor elements are disposed, in particular, in an annulus-segment-shaped manner in a circumferential direction and extend in the axial direction over a specific length. This is taken to mean, in particular, that in each case a type of bar composed of a p-doped and/or n-doped thermoelectric material extends along the axial direction of the inner tube or of the outer tube. The length of these bar-shaped semiconductor elements is long enough that a plurality of (smaller) semiconductor elements can be produced therefrom in a later step of the method through the use of a separating process. It is preferred for the bar-shaped semiconductor elements to have such a length that they extend over a significant proportion of the axial direction of the inner tube/outer tube, e.g. at least 50% or even at least 80%. Accordingly, through the use of the separating process, a plurality or even multiplicity of (e.g. substantially parallelepipedal) semiconductor elements are preferably produced from one bar-shaped semiconductor element. The (bar-shaped) semiconductor elements are disposed, in particular, on the inner tube at corresponding positions and are connected to electrically conductive first connections and/or second connections which are possibly provided. In particular, this connection is embodied in a cohesive fashion, that is to say that, if appropriate, in this case a solder or brazing material or adhesive is disposed between electrically conductive connections and the semiconductor elements, in such a way that the semiconductor elements are fixed with regard to their position on the inner tube.

The outer tube can be pushed, in particular, onto the inner tube, which has already been connected to the semiconductor elements. In particular, a calibration step is then effected, wherein the diameter of the inner tube is expanded and/or the diameter of the outer tube is reduced, with the result that a gap-free assembly of semiconductor elements, inner tube and outer tube can be made possible.

Subsequently, preferably a plurality of separating locations are introduced at least into the outer tube and into the semiconductor elements, in such a way that the semiconductor elements with a length in the axial direction are now divided into sections, wherein within a section the n-doped and p-doped semiconductor elements disposed alternately in the circumferential direction in each case produce a ring. As a result of the introduction of a plurality of separating locations, which in particular run parallel to one another in the circumferential direction, the semiconductor elements are subdivided into axial sections and rings having n-doped and p-doped semiconductor elements disposed alternately in the circumferential direction are thus produced. As a result of the further introduction of separating locations in the axial direction, electrically conductive first connections are produced between respectively n-doped and p-doped semiconductor elements of a ring, in such a way that they are alternately connected to one another in the circumferential direction through their outer sides or their inner sides.

In accordance with one advantageous configuration of the method, at least at one location of each ring, the separating location is introduced in such a way that it is possible to connect differently doped semiconductor elements of adjacent rings through their outer side. This electrically conductive second connection then runs both in an axial direction, in order to bridge the distance between two adjacent sections or two adjacent rings, and in the circumferential direction, in order to overcome their distance between the n-doped and p-doped semiconductor elements.

This separating process is introduced, in particular, through the use of a mechanical machining method, but can also be introduced by thermal methods, such as welding or plasma cutting. Further possible methods are e.g. laser beam cutting or water jet cutting. Moreover, chemical separating processes, e.g. eroding processes, can be used to correspondingly shape the outer tube.

This method makes it possible to simplify the complicated process for positioning the multiplicity of semiconductor elements. Only a small number of elongated semiconductor elements are required as starting material, which elements can be disposed alongside one another in the circumferential direction on the cylindrical inner tube. It is correspondingly possible to prepare an inner tube already having a possibly required insulation layer and a correspondingly applied conductor track structure of first and/or second connections. The correspondingly applied semiconductor elements can have possibly required barrier layers which can prevent the indiffusion of undesired elements, e.g. from the electrically conductive connection, into the semiconductor element material. On the other hand, however, the electrically conductive connections can also be produced from a material which prevents a corresponding diffusion or in the case of which a diffusion need not be feared.

The subsequent at least partial separation of the semiconductor elements and of the outer tube makes it possible to produce a corresponding electrically conductive first connection and/or second connection, in such a way that a secure electrical connection of the entire thermoelectric module is realized. In other words, that also means that a reproduction of the semiconductor elements and an embodiment of the connection pattern of the electrically conductive connections can be simultaneously achieved with step e). In particular, it is possible to provide inner tubes and outer tubes of arbitrary length, on which a plurality of parallelepipedal semiconductor elements are disposed in succession in an axial direction and alongside one another in a circumferential direction of the tubular thermoelectric module.

The interspace between the semiconductor elements is, in particular, not filled, but rather can be filled with air or evacuated in the finished produced thermoelectric module. Either air or a vacuum or alternatively a protective gas atmosphere produces firstly an electrical insulation of the semiconductor elements from one another and also a very good thermal insulation of the hot side from the cold side of the thermoelectric module. The hot side of the thermoelectric module is provided, in particular, on the side of the inner tube of the thermoelectric module, but can, without restriction, also be provided on the side of the outer tube.

Other features which are considered as characteristic for the invention are set forth in the appended claims, noting that the features individually presented in the claims can be combined with one another in any technologically expedient manner and indicate further configurations of the invention.

Although the invention is illustrated and described herein as embodied in a tubular thermoelectric module and a method for producing the module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, noting that advantageous configurations of the invention and the integration of this invention into superordinate structural units and the use thereof are specified in the dependent claims and/or in the description.

DETAILED DESCRIPTION OF THE INVENTION

Figure 1:
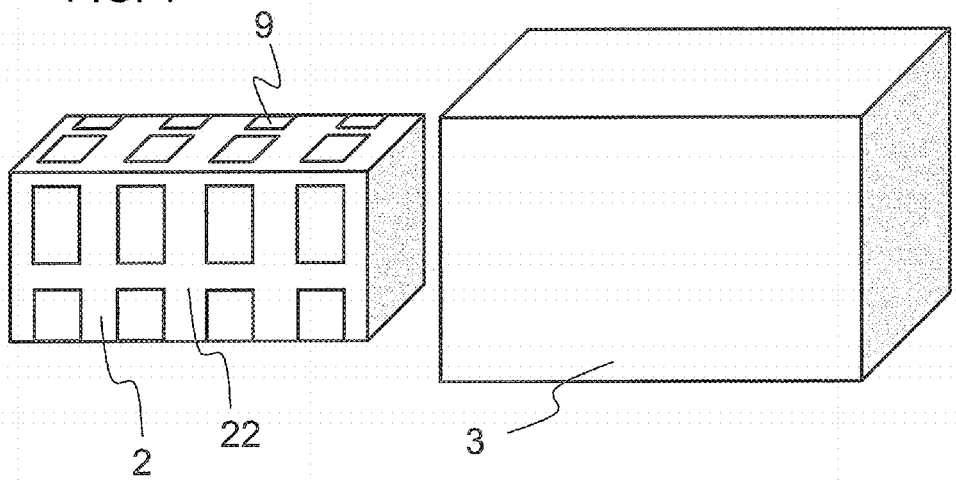
FIG. 1 is a diagrammatic, perspective view showing steps a) and b) of the method according to the invention.

Referring now in detail to the figures of the drawings which show particularly preferred embodiment variants to which the invention is not restricted and first, particularly, to FIG. 1 thereof, there is seen an outer tube 3 and an inner tube 2 during step a) of the method according to the invention. The inner tube 2 already has electrically conductive first connections 9 disposed on an outer surface of the inner tube 2. Furthermore, an insulation layer 22 is disposed on the outer surface of the inner tube 2. The insulation layer electrically insulates the electrically conductive first connections 9 from the (metallic) inner tube 2.

Figure 2:
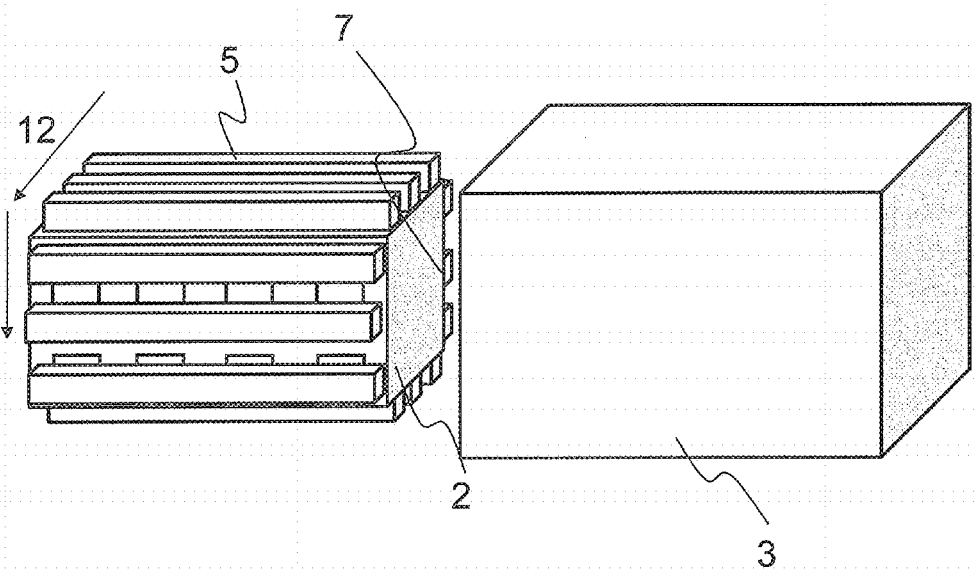
FIG. 2 is a perspective view showing step c) of the method according to the invention.

FIG. 2 illustrates step b) of the method according to the invention, wherein a plurality of bar-shaped semiconductor elements 5 are disposed on the outer surface of the inner tube 2. In this case, the semiconductor elements 5 are disposed in such a way that n-doped and p-doped semiconductor elements are positioned alongside one another alternately in a circumferential direction 12. The electrically conductive first connections 9 are disposed in such a way that inner sides 7 of adjacent n-doped and p-doped semiconductor elements 5 are electrically conductively connected to one another. This electrically conductive first connection 9 of the adjacent semiconductor elements 5 is effected only in pairs, so that always only two semiconductor elements 5 are connected to one another through their inner sides 7 by the electrically conductive first connections 9.

Figure 3:
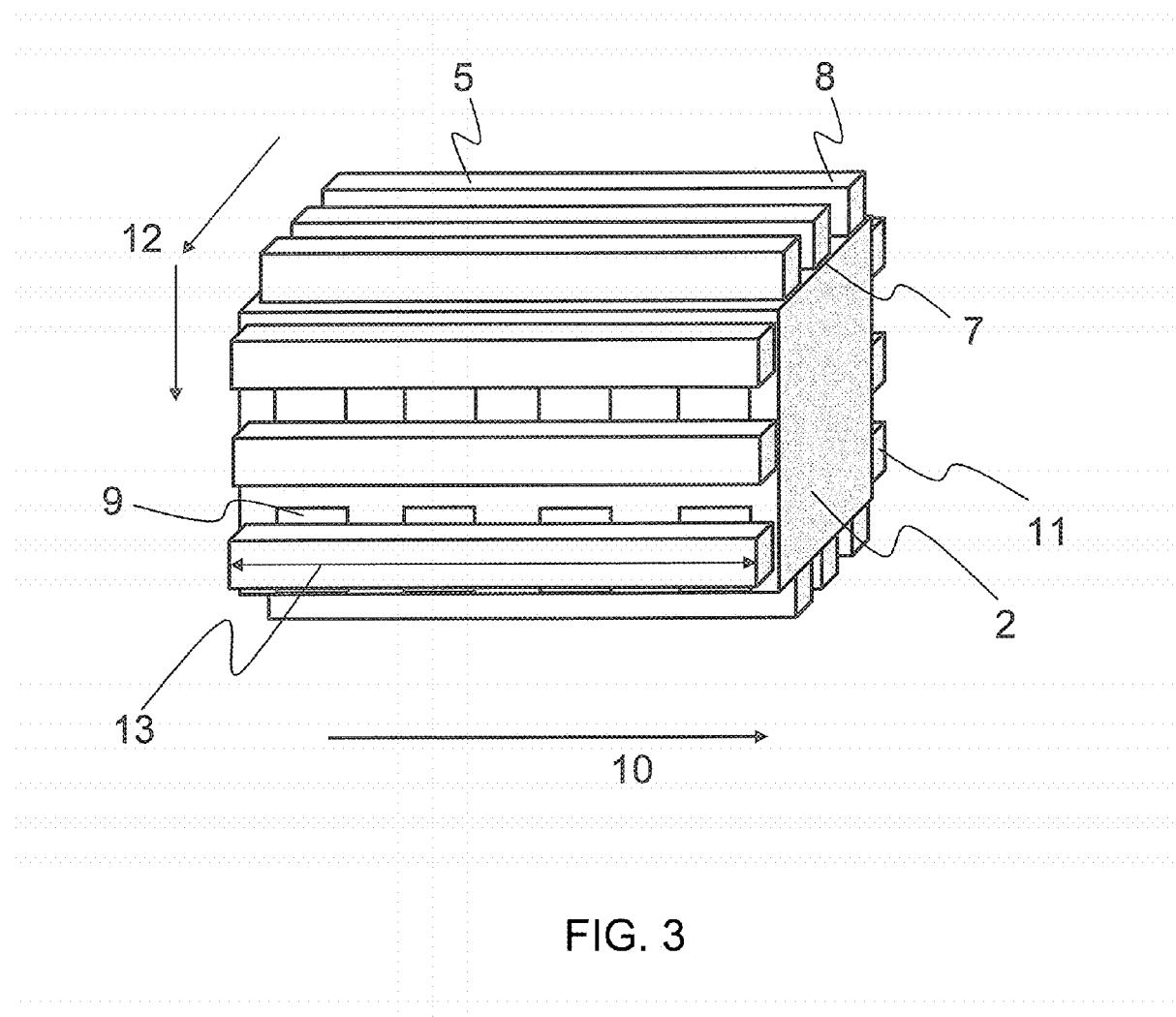
FIG. 3 is an enlarged perspective view showing a portion of FIG. 2.

FIG. 3 shows the inner tube 2 with the semiconductor elements 5 according to FIG. 2 in an enlarged view for illustrating the configuration of the semiconductor elements 5 on the inner tube 2. The semiconductor elements 5 extend over a length 13 in an axial direction 10. The semiconductor elements 5 are disposed alternately in the circumferential direction 12 as n-doped and p-doped semiconductor elements 5 on the outer side of the inner tube 2. The semiconductor elements 5 have the inner side 7 and an outer side 8. The inner side 7 is at least partly connected to the inner tube 2 and the outer side 8 is at least partly connectable to the outer tube 3. A semiconductor element 5 of the same type, that is to say an n-doped or a p-doped semiconductor element 5, is disposed in the axial direction 10 at each circumferential coordinate 11. This should be taken into consideration, in particular, in the case of a placement of a plurality of thermoelectric modules in succession.

Figure 4:
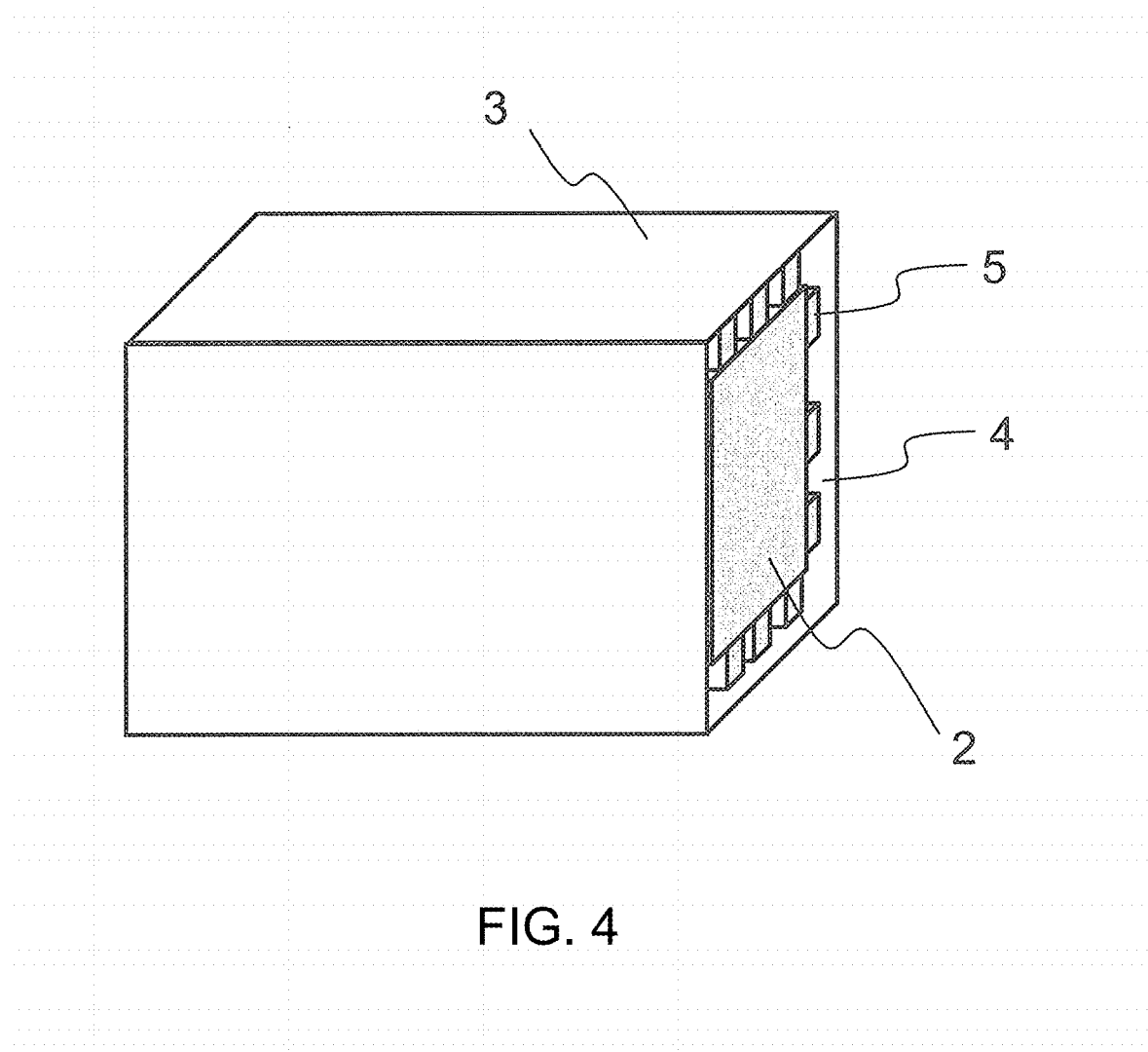
FIG. 4 is a perspective view showing step d) of the method according to the invention.

FIG. 4 illustrates step d) of the method according to the invention, wherein the outer tube 3 is connected to the inner tube 2 through the semiconductor elements 5. An interspace 4 is formed between the outer tube 3 and the inner tube 2.

Figure 5:
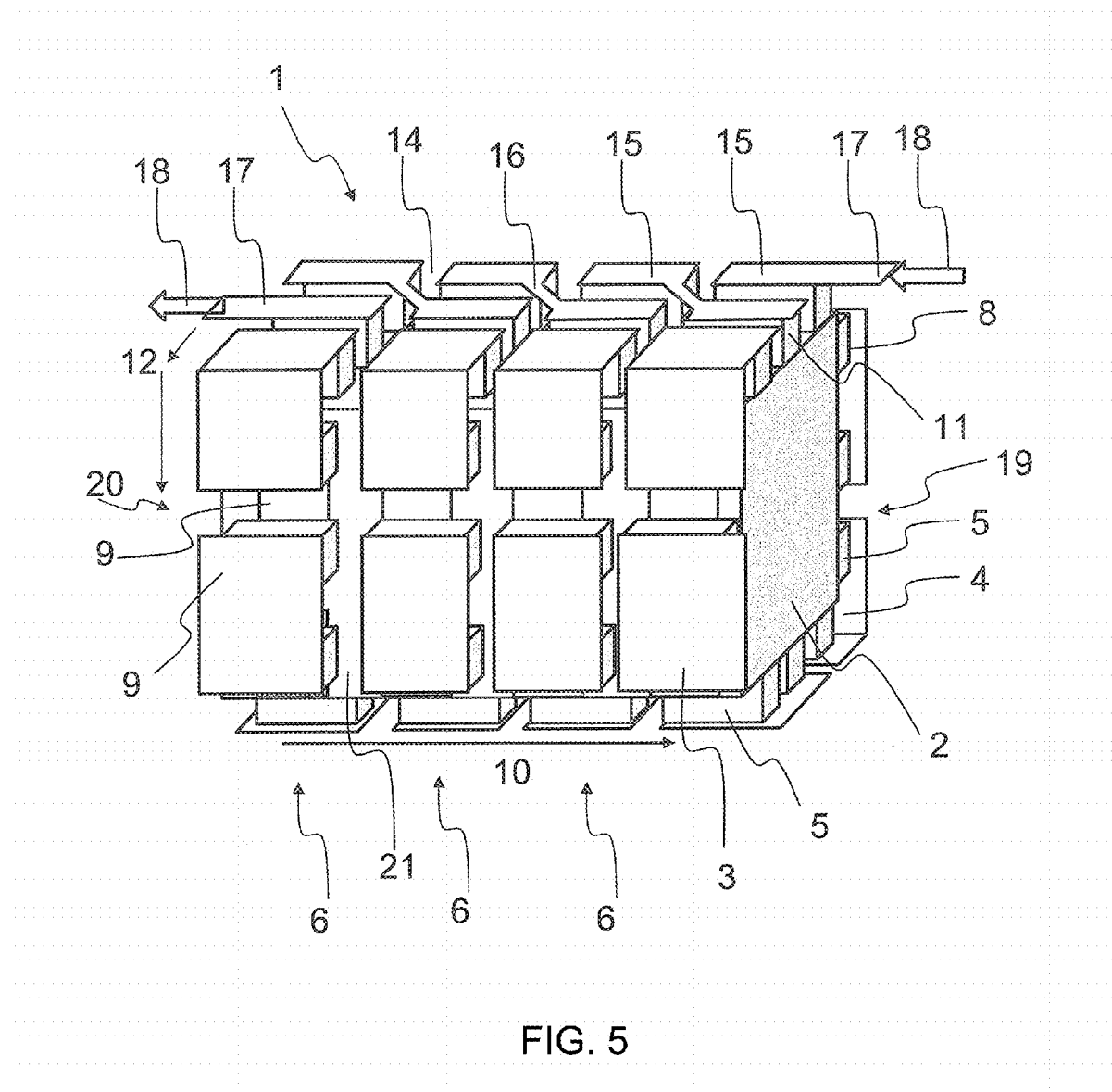
FIG. 5 is a perspective view showing a finished thermoelectric module after step e).

FIG. 5 shows the finished thermoelectric module 1 after step e) of the method. The outer tube 3 is divided by a separating process into electrically conductive first connections 9 and electrically conductive second connections 16, each connecting adjacent, differently doped semiconductor elements 5 to one another in each case in pairs through their outer sides 8. Furthermore, the parallelepipedal semiconductor elements 5 have been subdivided into sections 15 by the separating process, in such a way that rings 6 having n-doped and p-doped semiconductor elements 5 disposed alternately in the circumferential direction 12 are in each case disposed in succession in the axial direction 10. The electrically conductive second connections 16 are formed by the outer tube 3 at a circumferential coordinate 11 that is identical for each ring 6. The second connections run both in the axial direction 10 and in the circumferential direction 12 in order to connect differently doped semiconductor elements 5 of adjacent rings 6 to one another through their outer sides 8. As a result of this configuration of the electrically conductive connections 9, 16, it is possible to produce a current path 18 through the thermoelectric module 1 which, proceeding from a contact 17 at a first end side 19, runs in the axial direction 10, in the circumferential direction 12 and through the semiconductor elements 5 also in the radial direction to a contact 17 at a second end side 20. Thus, the thermoelectric module 1 is connectable to other thermoelectric modules 1 of the same type in a series configuration or can produce a thermoelectric generator with other thermoelectric modules 1 in a parallel configuration.

The outer tube 3 is open toward the outside as a result of separating locations 14. The configuration shown in FIG. 5 can therefore be accommodated by a further outer housing tube. The latter is subsequently calibrated, in particular, in such a way that a gap-free linking of the outer housing tube and the outer tube 3 is made possible. The interspace 4 between the inner tube 2, the outer tube 3 or the outer housing tube is filled firstly by the semiconductor elements 5 and secondly by an insulation 21. The insulation 21 is preferably air or a vacuum induced after the application of the outer housing tube, or a protective gas atmosphere.

The present invention proposes a thermoelectric module including, as a result of the special configuration of electrically conductive first connections and second connections, an asymmetrical configuration of electrically conductive connections which are provided on an inner side of semiconductor elements relative to electrically conductive connections which are disposed on an outer side of the semiconductor elements.

The invention claimed is:

1. A method for producing a thermoelectric module, the method comprising the following steps:
 a) providing an inner tube;
 b) providing an outer tube;
 c) placing semiconductor elements, having a length in axial direction, between the inner tube and the outer tube;
 d) connecting the inner tube, the outer tube and the semiconductor elements; and
 e) introducing at least one separating location at least into the outer tube and into the semiconductor elements, the at least one separating location subdividing the outer tube and subdividing the length of the semiconductor elements into at least two sections by:
  cutting in a circumferential direction through the outer tube and the semiconductor elements and in an axial direction along gaps between the semiconductor elements;
  creating electrical conductive paths on the outside of the semiconductor elements;
  cutting the semiconductor elements only in the circumferential direction creating rings of thermoelectric elements;
  electrically interconnecting the semiconductor elements in the circumferential direction; and
  electrically interconnecting neighboring rings at least in one position.

2. The method according to claim 1, wherein each of the semiconductor elements is a p-doped or n-doped semiconductor element.

* * * * *